United States Patent
Cheng et al.

(10) Patent No.: US 11,244,824 B2
(45) Date of Patent: Feb. 8, 2022

(54) CONFORMAL DOPED AMORPHOUS SILICON AS NUCLEATION LAYER FOR METAL DEPOSITION

(71) Applicant: Applied Materials, Inc., Santa Clara, CA (US)

(72) Inventors: Rui Cheng, Santa Clara, CA (US); Yihong Chen, San Jose, CA (US); Yong Wu, Sunnyvale, CA (US); Abhijit Basu Mallick, Palo Alto, CA (US); Srinivas Gandikota, Santa Clara, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 16/754,619

(22) PCT Filed: Oct. 9, 2018

(86) PCT No.: PCT/US2018/054932
§ 371 (c)(1),
(2) Date: Apr. 8, 2020

(87) PCT Pub. No.: WO2019/074877
PCT Pub. Date: Apr. 18, 2019

(65) Prior Publication Data
US 2020/0335334 A1    Oct. 22, 2020

Related U.S. Application Data

(60) Provisional application No. 62/569,883, filed on Oct. 9, 2017.

(51) Int. Cl.
*H01L 21/02* (2006.01)
*H01L 21/285* (2006.01)

(52) U.S. Cl.
CPC .... *H01L 21/02532* (2013.01); *H01L 21/0257* (2013.01); *H01L 21/0262* (2013.01);
(Continued)

(58) Field of Classification Search
None
See application file for complete search history.

(56) References Cited

U.S. PATENT DOCUMENTS 4,766,006 A  *  8/1988  Gaczi ............... H01L 21/28518
                                                                    427/535
5,227,329 A       7/1993  Kobayashi et al.
(Continued)

FOREIGN PATENT DOCUMENTS

CN    102176496    *   9/2011
CN    104393120    *   3/2015
(Continued)

OTHER PUBLICATIONS

PCT International Search Report and Written Opinion in PCT/US2018/054932, dated Jan. 31, 2019.
(Continued)

*Primary Examiner* — Bo B Jang
(74) *Attorney, Agent, or Firm* — Servilla Whitney LLC

(57) ABSTRACT

Methods for depositing a metal film on a doped amorphous silicon layer as a nucleation layer and/or a glue layer on a substrate. Some embodiments further comprise the incorporation of a glue layer to increase the ability of the doped amorphous silicon layer and metal layer to stick to the substrate.

18 Claims, 3 Drawing Sheets

(52) U.S. Cl.
CPC .. *H01L 21/02488* (2013.01); *H01L 21/02592* (2013.01); *H01L 21/28556* (2013.01); *H01L 21/28568* (2013.01)

(56) References Cited

U.S. PATENT DOCUMENTS

| | | | |
|---|---|---|---|
| 5,789,030 | A | 8/1998 | Rolfson |
| 6,197,669 | B1 | 3/2001 | Twu |
| 10,468,263 | B2 | 11/2019 | Chen et al. |
| 2006/0128139 | A1 | 6/2006 | Paranjpe et al. |
| 2012/0091414 | A1* | 4/2012 | Iwakaji ............ H01L 21/02516 257/2 |
| 2017/0179036 | A1 | 6/2017 | Chen et al. |

FOREIGN PATENT DOCUMENTS

| | | |
|---|---|---|
| WO | 00/06795 A1 | 2/2000 |
| WO | 2007075369 A1 | 7/2007 |
| WO | 2017106660 A1 | 6/2017 |

OTHER PUBLICATIONS

Non-Final Office Action in U.S. Appl. No. 16/588,235, dated Apr. 10, 2020.

Non-Final Office Action in U.S. Appl. No. 16/835,279 dated Sep. 14, 2020, 12 pages.

\* cited by examiner

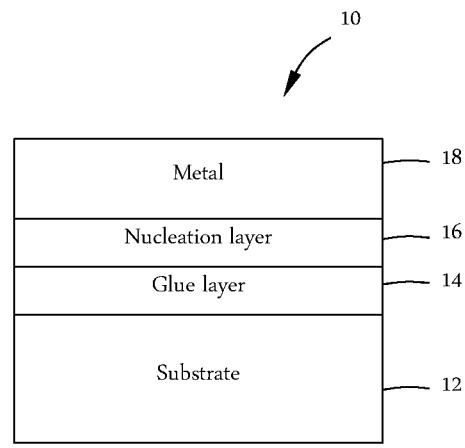
FIG. 1
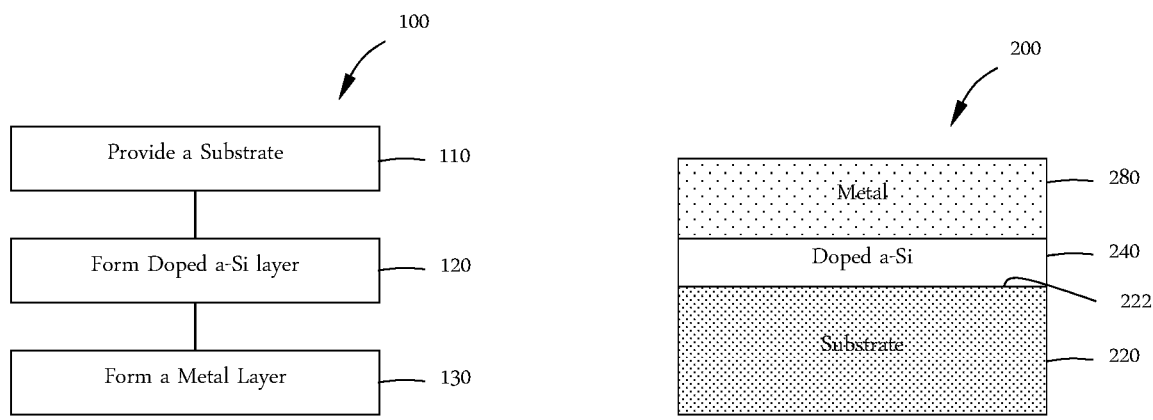
FIG. 2A
FIG. 2B

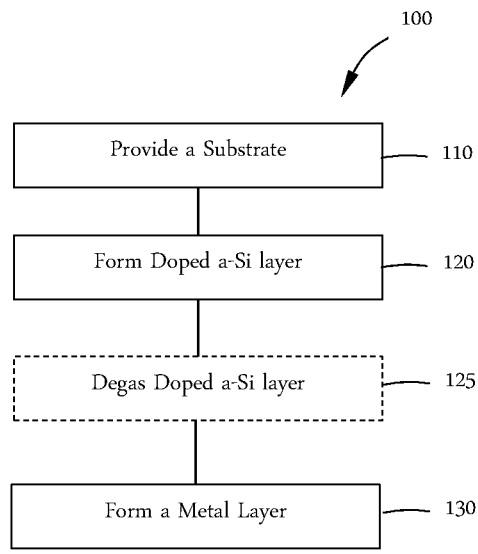
FIG. 3
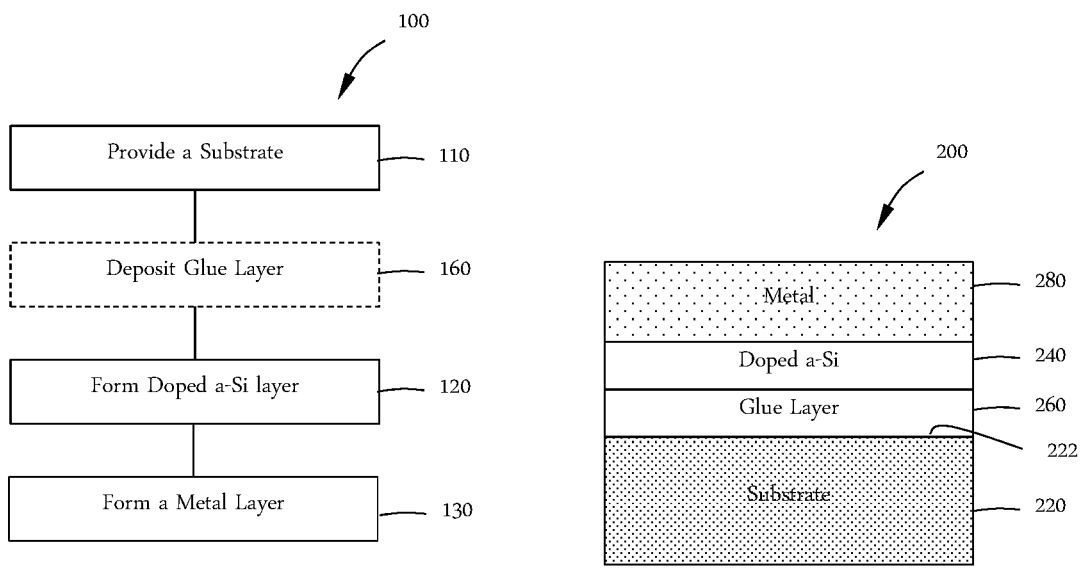
FIG. 4A                    FIG. 4B

CONFORMAL DOPED AMORPHOUS SILICON AS NUCLEATION LAYER FOR METAL DEPOSITION

CROSS-REFERENCE TO RELATED APPLICATIONS

This application is the National Stage entry of PCT/US2018/054932, filed on Oct. 9, 2018, which claims priority to U.S. Provisional Application Ser. No. 62/569,883, filed Oct. 9, 2017, the entire disclosures of which are hereby incorporated by reference herein.

TECHNICAL FIELD

The present disclosure relates generally to methods of depositing thin films. In particular, the disclosure relates to processes for the deposition of films comprising doped amorphous silicon.

BACKGROUND

Amorphous silicon is widely used in semiconductor devices, flat-panel displays, and solar cells. There remains a key technical challenge for the development of amorphous silicon deposition process with conformality (i.e., good step coverage) or gap-fill performance in high aspect-ratio features. A conventional LPCVD process is limited to high temperature (>550° C.) and low pressure, and, therefore, exhibits poor step coverage and/or gap-fill performance; PECVD processes also do not give good step coverage and/or gap-fill performance.

The atomic layer deposition (ALD) of tungsten thin films exhibits very long incubation delay's on silicon, silicon dioxide and titanium nitride services due to poor nucleation performance. A nucleation layer is usually used to mitigate this issue. Conventionally, ALD $WSi_x$ or $WB_x$ is deposited by $WF_6/Si_2H_6$ and $WF_6/B_2H_6$, respectively. However, $WF_6$ is directly exposed to the substrate surface (e.g., Si, $SiO_2$) and damages the substrate.

Therefore, there is a need in the art for methods of depositing metal films with high conformality at lower temperatures.

SUMMARY

One or more embodiments of the disclosure are directed to processing methods comprising exposing a substrate surface to a silicon precursor and a dopant to form a doped amorphous silicon layer having a thickness. A metal layer is formed on the doped amorphous silicon layer.

Additional embodiments of the disclosure are directed to stacks comprising a substrate having an oxide surface. A glue layer is on the oxide surface; the glue layer comprises TiN. A doped amorphous silicon layer is on the glue layer and comprises one or more of boron, phosphorous, arsenic or germanium. A metal layer is on the doped amorphous silicon layer and comprises one or more of tungsten or molybdenum.

Further embodiments of the disclosure are directed to processing methods comprising providing a silicon substrate having a silicon oxide surface. A glue layer is formed on the silicon substrate. The glue layer comprises TiN with a thickness in the range of about 1 Å to about 30 Å. A doped amorphous silicon layer is formed on the glue layer by exposing the glue layer to a silicon precursor comprising disilane and a dopant comprising diborane. The substrate is maintained at a temperature less than or equal to about 100° C. A metal layer is formed on the amorphous silicon layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 shows schematic of a film stack in accordance with one or more embodiment of the disclosure;

FIG. 2A shows a process scheme in accordance with one or more embodiment of the disclosure;

FIG. 2B shows a schematic of a film stack in accordance with the process scheme of FIG. 2A;

FIG. 3 shows a process scheme in accordance with one or more embodiment of the disclosure;

FIG. 4A shows a process scheme in accordance with one or more embodiment of the disclosure;

FIG. 4B shows a schematic of a film stack in accordance with the process scheme of FIG. 4A.

DETAILED DESCRIPTION

Figure 5:
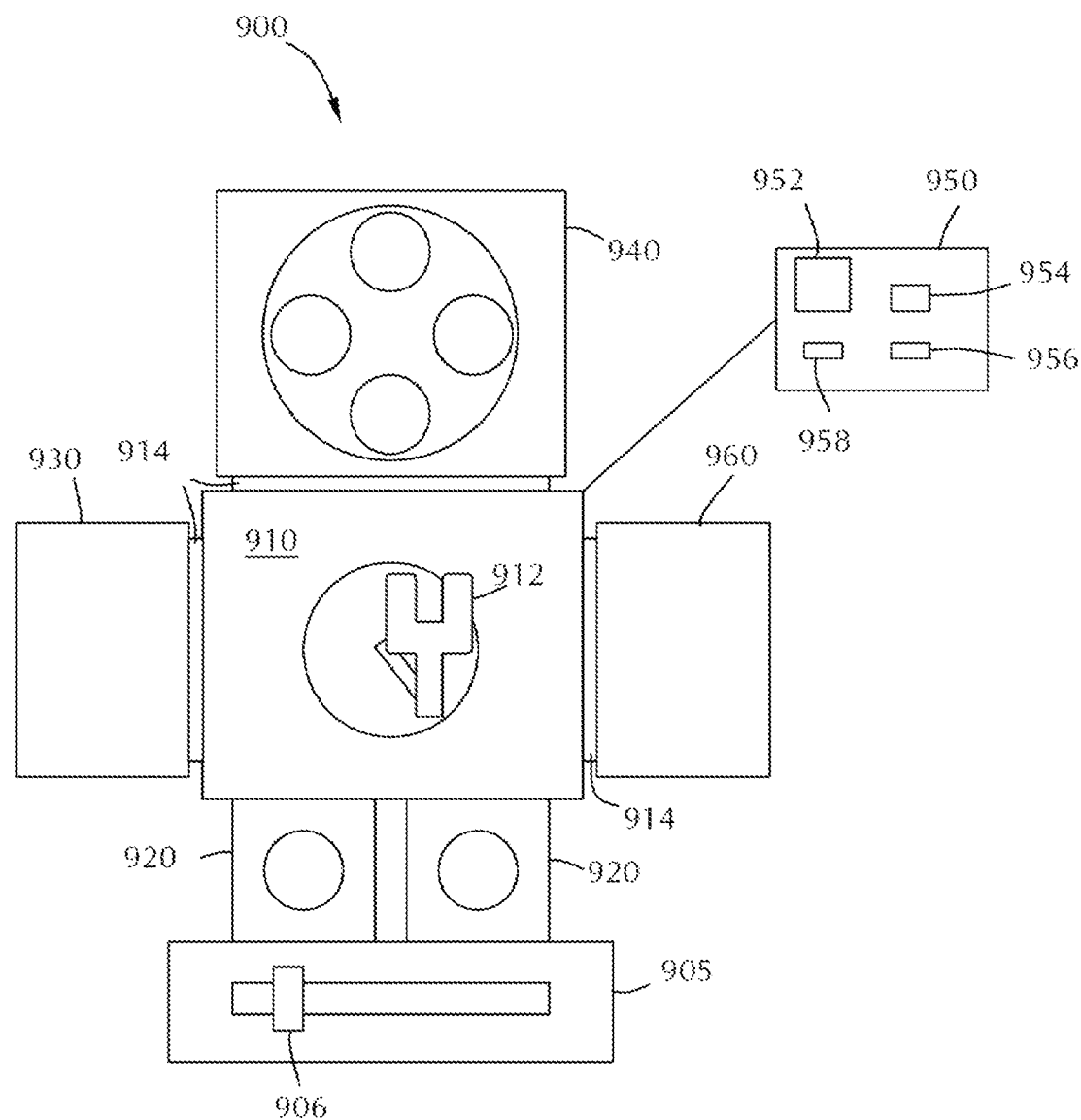
FIG. 5 shows an exemplary system for processing a substrate in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

One or more embodiments of the disclosure are directed to methods of depositing a conformal doped amorphous silicon thin film as one or more of a glue layer, a fluorine diffusion barrier and/or a nucleation layer for metal deposition (e.g., ALD tungsten deposition). While tungsten deposition is referred to in many embodiments, those skilled in the art will understand that other metals (e.g., Mo) could be deposited by the disclosed process. The disclosure is not limited to ALD tungsten deposition, ALD deposition or tungsten deposition.

Embodiments of the disclosure include process integration schemes for metal ALD processes. For example, tungsten deposited by atomic layer deposition on a silicon substrate. With reference to FIG. 1, a stack 10 may include a substrate 12 (e.g., $SiO_2$) with a glue layer 14 (e.g., TiN), a nucleation layer 16 (e.g., $WSi_x$ and $WB_x$) and a metal 18 (e.g., W). In one or more embodiment of a process scheme, a nucleation layer is replaced with a doped amorphous silicon layer. In some embodiments, the nucleation layer is replaced with a doped amorphous silicon layer and the TiN glue layer is made thinner. In one or more embodiments, both the nucleation layer and glue layer are replaced with a doped amorphous silicon layer.

With reference to FIGS. 2A and 2B, one or more embodiments of the disclosure are directed processing methods 100 and film stacks 200. A substrate 220 having a substrate surface 222 is provided in step 110. In step 120, the substrate 220 exposed to a silicon precursor and a dopant to form a doped amorphous silicon layer 240 on the substrate surface 222.

Some embodiments of this disclosure advantageously provide methods of lowering deposition temperature of a nucleation layer by incorporating a dopant. In some embodiments, the morphology of a nucleation layer is modified by adding dopant during the conformal amorphous silicon layer deposition. In some embodiments, the deposition temperature of amorphous silicon can be reduced from greater than or equal to about 400° C. to less than or equal to about 100° C. or below. In some embodiments, tungsten film properties can be advantageously modified by changing dopant concentrations due to the different film properties/morphology of doped silicon films as compared to non-doped amorphous silicon films.

In some embodiments, the doped amorphous silicon (doped a-Si) formation can be achieved by maximizing the partial pressure of the silicon precursor while minimizing the wafer temperature. In some embodiments, the doped amorphous silicon is deposited using a CVD deposition process where the silicon precursor and the dopant are exposed to the substrate simultaneously.

Suitable silicon precursors include, but are not limited to, polysilanes ($Si_xH_y$) and halosilanes ($Si_xH_yX_a$). For example, polysilanes include silane, disilane ($Si_2H_6$), trisilane ($Si_3H_8$), tetrasilane ($Si_4H_{10}$), isotetrasilane, neopentasilane ($Si_5H_{12}$), cyclopentasilane ($Si_5H_{10}$, hexasilane ($C_6H_{14}$), cyclohexasilane ($Si_6H_{12}$) or, in general, $Si_xH_y$ where x=1 or more, and combinations thereof. For example, disilane, which has a moderate processing temperature and high vapor pressure, may be used as the silicon precursor alone or in combination with other species.

For example, halosilanes include dihalosilane ($SiH_2X_2$), trihalosilane ($SiHX_3$), tetrahalosilane ($SiX_4$), or hexahalodisilane ($Si_2X_6$) or, in general, $Si_xH_yX_a$ where x=1 or more X is a halogen and a=1 or more, and combinations thereof. In some embodiments, the halogen present in the halosilane is independently selected from fluorine, chlorine, bromine or iodine. In some embodiments, the halogen consists essentially of chlorine.

In some embodiments, the silicon precursor comprises substantially only disilane. In some embodiments, the silicon precursor comprises substantially only dichlorosilane. As used in this specification and the appended claims, the phrase "substantially only" means that at least 95% of the active species is the stated species. Other gases, such as carrier gases and inert gases, can be included in any amount.

The dopant may be any material suitable for doping the deposited amorphous silicon layer. In some embodiments, the doped amorphous silicon layer comprises one or more of boron, phosphorous, arsenic or germanium. In some embodiments, the dopant comprises one or more of borane, diborane, phosphine, diphosphine, arsine, diarsine, germane or digermane. In some embodiments, the dopant comprises substantially only diborane. In some embodiments, the dopant comprises substantially only diphosphine. In some embodiments, the dopant comprises substantially only diarsine. In some embodiments, the dopant comprises substantially only digermane.

The thickness of the doped amorphous silicon layer 240 can vary depending on, for example, the substrate surface and subsequent films and processes. In some embodiments, the doped amorphous silicon layer 240 has a thickness greater than or equal to about 20 Å. In one or more embodiments, the doped amorphous silicon layer 240 has a thickness in the range of about 1 Å to about 200 Å, or in the range of about 10 Å to about 150 Å, or in the range of about 20 Å to about 100 Å, or in the range of about 40 Å to about 100 Å. In some embodiments, the doped amorphous silicon layer 240 has a thickness in the range of about 10 Å to about 50 Å. In some embodiments, the thickness of the doped amorphous silicon layer 240 is greater than 0 Å and less than or equal to about 100 Å, 75 Å, 50 Å, 45 Å or 40 Å. In some embodiments, the doped amorphous silicon layer 240 has a minimum thickness sufficient to form a continuous layer. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

In some embodiments, the doped amorphous silicon layer 240 forms conformally on the substrate 220. As used herein, the term "conformal", or "conformally", refers to a layer that adheres to and uniformly covers exposed surfaces with a thickness having a variation of less than 1%) relative to the average thickness of the film. For example, a 100 Å thick film would have less than 1 Å variations in thickness. This thickness and variation includes edges, corners, sides, and the bottom of recesses. For example, a conformal layer deposited in various embodiments of the disclosure would provide coverage over the deposited region of essentially uniform thickness on complex surfaces.

A metal layer 280 is formed on the doped amorphous silicon layer 240 in step 130. The metal layer 280 can be formed by any suitable technique including, but not limited to, atomic layer deposition (ALD), plasma-enhanced atomic layer deposition (PE-ALD), chemical vapor deposition (CVD), plasma-enhanced chemical vapor deposition (PE-CVD) and physical vapor deposition (PVD).

The metal layer 280 can comprise any suitable metal. In some embodiments, the metal layer 280 comprises one or more of tungsten or molybdenum. In some embodiments, the metal layer 280 consists essentially of tungsten. In some embodiments, the metal layer 280 consists essentially of molybdenum. As used in this regard, "consists essentially of" means that the metal layer 280 is greater than or equal to about 80, 85, 90 or 95 atomic % of the specified component. For example, a metal layer 280 consisting essentially of tungsten has a composition that is greater than or equal to about, for example, 90 atomic % tungsten.

In some embodiments, the metal layer 280 is deposited by CVD. A metal precursor and a reactant may be coflowed into a processing chamber to deposit a layer on the substrate. The precursor and reactant are allowed to react in the gas phase.

In some embodiments, the metal layer 280 is deposited by ALD. In a time-domain ALD process, the metal precursor is flowed into the processing chamber to react with the surface. The chamber is purged of excess precursor and byproducts and the reactant is flowed into the chamber. The precursor and reactant are not in the processing chamber at the same time so there is minimal or no gas phase reactions. In a spatial ALD process, the metal precursor is flowed into a first section of a processing chamber and the reactant is simultaneously flowed into a second section of the processing chamber. The first section and second section are separated by a gas curtain to prevent gas phase reactions between the precursor and reactant. The substrate is moved between the first section and the second section to sequentially expose the surface to the precursor and reactant. In some embodiments, the metal layer 280 is deposited by sequentially exposing the doped amorphous silicon layer 240 to a metal precursor and a reactant.

The metal precursor can be any suitable precursor that can be used to deposit a metal film. In some embodiments, the metal precursor comprises a metal selected from tungsten, molybdenum and combinations thereof. In one or more embodiments, the metal precursor comprises one or more of $WF_6$ and $MoF_6$. In some embodiments, the metal precursor is a fluorine containing precursor. It is known that fluorine may etch silicon surface. Some embodiments of the disclosure advantageously allow the use of fluorine precursors because the doped amorphous silicon layer 240 can be formed to a thickness sufficient to ensure that the precursor does not remove all of the doped amorphous silicon film.

The reactant can be any suitable reactant that is able to react with a species formed on the surface. For example, in an ALD process, if $WF_6$ is used as the precursor, there will be $-WF_x$ species on the surface. The reactant is able to react with the $-WF_x$ species to produce a W film.

FIG. 3 shows a process flow for another embodiment of the disclosure in which a degas process 125 is included after formation of the doped amorphous silicon layer 240. The doped amorphous silicon layer 240 in some embodiments is exposed to a degas environment to remove outgassed species prior to forming the metal layer 280.

The deposited doped amorphous silicon layer 240 may evolve or outgas a species, for example, hydrogen. The degas environment provides an opportunity for the gaseous species to evolve, minimizing bubbling of the final film. The degas environment can include any condition with allows or encourages degassing of the film. For example, the degas environment may consists essentially of an inert gas. As used in this regard, "consists essentially of" means that there is no gaseous species that interfere with the outgassing of the deposited film. Other reactive species may be present without inhibiting degassing of the film while still consisting essentially of an inert gas.

Suitable inert gases include, but are not limited to, one or more of argon, helium, nitrogen, and/or mixtures thereof.

In one or more embodiments, the outgassed species comprises hydrogen, $SiH_2$, $SiH_3$, $SiH_4$, and/or other low-order silanes.

The pressure in the processing chamber, or region of the processing chamber can be independently controlled for the precursor exposure and degas environment. In some embodiments, exposure to each of the silicon precursor, dopant and the degas environment occurs at a pressure in the range of about 100 mTorr to about 600 Torr. In some embodiments, the silicon precursor and/or the dopant is exposed to the substrate at a pressure greater than or equal to about 500 mTorr, or greater than or equal to about 1 Torr, or greater than or equal to about 5 Torr, or greater than or equal to about 10 Torr, or greater than or equal to about 20 Torr, or greater than or equal to about 30 Torr.

The temperature at which the substrate surface is exposed to the silicon precursor, dopant and/or degas environment can be varied depending on, for example, the thermal budget of the device being formed and the silicon precursor and/or dopant. In some embodiments, exposure to each of the silicon precursor, the dopant and/or the degas environment occurs at a temperature in the range of about 25° C. to about 700° C. In one or more embodiments, the doped amorphous silicon layer 240 is formed at a temperature in the range of about 25° C. to about 700° C., or in the range of about 50° C. to about 600° C., or in the range of about 100° C. to about 550° C. In some embodiments, the doped amorphous silicon layer 240 is formed at a temperature greater than or equal to about 25° C. and less than or equal to about 550° C., less than or equal to about 400° C., less than or equal to about 250° C., less than or equal to about 200° C., or less than or equal to about 100° C.

The thickness of the doped amorphous silicon layer 240 formed with the silicon precursor and the dopant before exposure to the degas environment can be modified. In some embodiments, each exposure to the silicon precursor, the dopant and the degas environment grows a film with a thickness in the range of about 5 Å to about 20 Å, or about 20 Å to about 100 Å, or about 40 Å to about 100 Å.

The precursor, dopant and degas environments can be repeatedly sequentially exposed to the substrate surface to form a film with a predetermined thickness. In some embodiments, the amorphous silicon film has a total thickness in the range of about 20 Å to about 1 μm.

Referring to FIGS. 4A and 4B, some embodiments of the disclosure further comprise step 160 in which a glue layer 260 is deposited on the substrate before forming the doped amorphous silicon layer 240. The glue layer 260 is a layer that the doped amorphous silicon can stick to with less likelihood of peeling than if the doped amorphous silicon layer was deposited directly onto the substrate 220. In some embodiments, the glue layer comprises TiN. In one or more embodiments, the substrate 220 has a silicon oxide surface and the glue layer comprises TiN.

The thickness of the glue layer 260 can vary depending on the substrate and the thickness of doped amorphous silicon to be deposited. In some embodiments, the glue layer 260 has a thickness in the range of about 1 Å to about 30 Å, or in the range of about 5 Å to about 30 Å. In some embodiments, the glue layer 260 has a thickness less than or equal to about 20 Å, or less than or equal to about 15 Å or less than or equal to about 10 Å or less than or equal to about 5 Å.

Referring to FIG. 4B, one or more embodiments of the disclosure are directed to stacks 200 comprising a substrate 220 having an oxide surface 222. A glue layer 260 is on the oxide surface 222. The glue layer of some embodiments comprises TiN with a thickness in the range of about 5 Å to about 30 Å. A doped amorphous silicon layer 240 is on the glue layer 260 and has a thickness in the range of about 5 Å to about 50 Å. A metal layer 280 is on the doped amorphous silicon layer 240 and comprises one or more of tungsten and molybdenum.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura and the Endura both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

With reference to FIG. 5, additional embodiments of the disclosure are directed to a processing system 900 for executing the methods described herein. FIG. 5 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 5, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as a silicon layer deposition chamber and may be in fluid communication with one or more reactive gas sources to provide one or more flows of reactive gases to the first processing chamber 930. The substrate can be moved to and from the processing chamber 930 by the robot 912 passing through isolation valve 914.

Processing chamber 940 can also be connected to the central transfer station 910. In some embodiments, processing chamber 940 comprises a metal deposition chamber and is fluid communication with one or more reactive gas sources to provide flows of reactive gas to the processing chamber 940 to perform the isotropic etch process. The substrate can be moved to and from the processing chamber 940 by robot 912 passing through isolation valve 914.

Processing chamber 945 can also be connected to the central transfer station 910. In some embodiments, the processing chamber 945 is the same type of processing chamber 940 configured to perform the same process as processing chamber 940. This arrangement might be useful where the process occurring in processing chamber 940 takes much longer than the process in processing chamber 930.

In some embodiments, processing chamber 960 is connected to the central transfer station 910 and is configured to act as a silicon layer deposition chamber. The processing chamber 960 can be configured to perform one or more different epitaxial growth processes.

In some embodiments, the processing chamber 930 and processing chamber 960 can be configured to perform the silicon deposition processes on two substrates at the same time and processing chamber 940 and processing chamber 945 can be configured to perform the metal deposition processes.

In some embodiments, each of the processing chambers 930, 940, 945 and 960 are configured to perform different portions of the processing method. For example, processing chamber 930 may be configured to perform the doped silicon layer formation process, processing chamber 940 may be configured to perform the metal layer formation process, processing chamber 945 may be configured as a metrology station or to perform a silicon layer formation process and processing chamber 960 may be configured to perform a metal layer formation process. The skilled artisan will recognize that the number and arrangement of individual processing chamber on the tool can be varied and that the embodiment illustrated in FIG. 5 is merely representative of one possible configuration.

In some embodiments, the processing system 900 includes one or more metrology stations. For example metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, processing chambers 930, 940, 945, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to form a doped amorphous silicon layer; a configuration to form a metal layer; and a configuration to deposit a glue layer on a substrate.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited.

Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
   depositing a glue layer comprising TiN with a thickness in a range of 1 Å to 30 Å on a substrate surface;
   exposing the glue layer to a silicon precursor and a dopant to form a doped amorphous silicon layer at a temperature less than or equal to 100° C.; and
   forming a metal layer on the doped amorphous silicon layer.

2. The method of claim 1, wherein the substrate surface is exposed to the silicon precursor and the dopant simultaneously.

3. The method of claim 1, wherein the silicon precursor comprises a silane or a halosilane.

4. The method of claim 3, wherein the silane comprises one or more of silane, disilane, trisilane, tetrasilane, isotetrasilane, neopentasilane, cyclopentasilane, hexasilane or cyclohexasilane.

5. The method of claim 3, wherein the halosilane comprises one or more of dihalosilane, trihalosilane, tetrahalosilane, or hexahalodisilane.

6. The method of claim 5, wherein the halogen of the halosilane consists of chlorine.

7. The method of claim 1, wherein the doped amorphous silicon layer comprises one or more of boron, phosphorous, arsenic or germanium.

8. The method of claim 7, wherein the dopant comprises one or more of borane, diborane, phosphine, germane or digermane.

9. The method of claim 7, wherein the doped amorphous silicon layer comprises one or more of phosphorous, arsenic or germanium.

10. The method of claim 1, wherein the metal layer is deposited by atomic layer deposition.

11. The method of claim 1, wherein the metal layer is formed by exposing the doped amorphous silicon layer to a metal precursor and a reactant, the metal precursor comprising one or more of $WF_6$ and $MoF_6$ and the reactant comprising hydrogen.

12. The method of claim 1, wherein a thickness of the silicon layer is in the range of about 20 Å to about 100 Å.

13. The method of claim 1, wherein the metal layer comprises one or more of tungsten and molybdenum.

14. A processing method comprising:
    providing a silicon substrate having a silicon oxide surface;
    forming a glue layer on the silicon substrate, the glue layer comprising TiN with a thickness in the range of about 1 Å to about 30 Å;
    forming a doped amorphous silicon layer on the glue layer by exposing the glue layer to a silicon precursor comprising disilane and a dopant comprising diborane, the substrate maintained at a temperature less than or equal to about 100° C.; and
    forming a metal layer on the doped amorphous silicon layer.

15. The method of claim 14, wherein the metal layer is formed by atomic layer deposition.

16. The method of claim 15, wherein the metal layer comprises one or more of tungsten and molybdenum.

17. The method of claim 16, wherein the metal layer is deposited by exposing the doped amorphous silicon layer to a metal precursor and a reactant, the metal precursor comprising one or more of $WF_6$ and $MoF_6$ and the reactant comprising hydrogen.

18. A stack comprising:
    a substrate having an oxide surface;
    a glue layer comprising TiN on the oxide surface with a thickness in a range of 1 Å to 30 Å;
    a doped amorphous silicon layer on the glue layer, the doped amorphous silicon layer comprising one or more of boron, phosphorous, arsenic or germanium; and
    a metal layer directly on the doped amorphous silicon layer, the metal layer comprising one or more of tungsten or molybdenum.

* * * * *